United States Patent
Siska

(10) Patent No.: US 9,337,833 B2
(45) Date of Patent: May 10, 2016

(54) DRIVEN SHIELD FOR SHAPING AN ELECTRIC FIELD OF A TOUCH SENSOR

(75) Inventor: Andrew Siska, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 94 days.

(21) Appl. No.: 13/523,372

(22) Filed: Jun. 14, 2012

(65) Prior Publication Data

US 2013/0120310 A1    May 16, 2013

Related U.S. Application Data

(60) Provisional application No. 61/559,690, filed on Nov. 14, 2011.

(51) Int. Cl.
*H03K 17/96*    (2006.01)
*H03K 17/945*    (2006.01)
*G01R 27/26*    (2006.01)
*G06F 3/044*    (2006.01)

(52) U.S. Cl.
CPC .......... *H03K 17/962* (2013.01); *G01R 27/2605* (2013.01); *G06F 3/044* (2013.01); *H03K 2217/96078* (2013.01); *H03K 2217/960765* (2013.01)

(58) Field of Classification Search
CPC ................. G06F 3/044; H03K 17/962; H03K 2217/960765; H03K 2217/96078
USPC .................................................. 345/173, 174
See application file for complete search history.

(56) References Cited

U.S. PATENT DOCUMENTS

| | | | |
|---|---|---|---|
| 5,457,289 A * | 10/1995 | Huang et al. | ............... 178/18.08 |
| 5,553,296 A * | 9/1996 | Forrest et al. | ................ 713/323 |
| 6,376,939 B1 | 4/2002 | Suzuki et al. | |
| 6,400,359 B1 | 6/2002 | Katabami | |
| 6,989,679 B2 | 1/2006 | Lieder et al. | |
| 7,663,607 B2 | 2/2010 | Hotelling | |
| 7,864,503 B2 | 1/2011 | Chang | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,120,371 B2 * | 2/2012 | Day et al. | ...................... 324/661 |

(Continued)

FOREIGN PATENT DOCUMENTS

WO    WO 2012/129247    9/2012

OTHER PUBLICATIONS

Bryce Osoinach, "Proximity Capacitive Sensor Technology for Touch Sensing Applications," 2008, Freescale Semiconductor, Inc.*

(Continued)

*Primary Examiner* — Quan-Zhen Wang
*Assistant Examiner* — Xuemei Zheng
(74) *Attorney, Agent, or Firm* — Baker Botts L.L.P.

(57) ABSTRACT

In one embodiment, a method comprises generating, by a control unit, a first drive signal and a second drive signal. The method further includes emitting, by a touch sensor, a first electric field that extends in a plurality of directions in response to reception of the first drive signal. The method also includes attenuating, by a conductive shield, a portion of the first electric field that extends from the touch sensor towards the conductive shield by generating a second electric field in response to reception of the second drive signal.

21 Claims, 3 Drawing Sheets

(56) References Cited

U.S. PATENT DOCUMENTS

| | | |
|---|---|---|
| 8,179,381 B2 | 5/2012 | Frey |
| 8,217,902 B2 | 7/2012 | Chang |
| 8,723,824 B2 | 5/2014 | Myers |
| 8,786,356 B2 | 7/2014 | Siska |
| 2003/0080755 A1 | 5/2003 | Kobayashi |
| 2008/0309635 A1 | 12/2008 | Matsuo |
| 2009/0315854 A1 | 12/2009 | Matsuo |
| 2010/0201647 A1* | 8/2010 | Verweg .................. 345/174 |
| 2010/0292945 A1* | 11/2010 | Reynolds et al. ............... 702/65 |
| 2011/0279409 A1* | 11/2011 | Salaverry et al. ............. 345/174 |
| 2012/0074961 A1* | 3/2012 | Herrmann .................. 324/658 |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2013/0076612 A1 | 3/2013 | Myers |
| 2013/0120052 A1 | 5/2013 | Siska |
| 2013/0241780 A1* | 9/2013 | Amm et al. .................. 343/702 |

OTHER PUBLICATIONS

U.S. Appl. No. 13/539,648, filed Jul. 2, 2012, Andrew Siska.
A. Siska, U.S. Appl. No. 13/539,648, Non-final Office Action from U.S. Patent Office, Aug. 19, 2013.
A. Siska, U.S. Appl. No. 13/539,648, Response to Non-final Office Action, Nov. 19, 2013.
A. Siska, U.S. Appl. No. 13/539,648, Notice of Allowance, Dec. 2, 2013.
A. Siska, U.S. Appl. No. 13/539,648, RCE and IDS, Feb. 28, 2014.
A. Siska, U.S. Appl. No. 13/539,648, Notice of Allowance, Mar. 12, 2014.
U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

* cited by examiner

DRIVEN SHIELD FOR SHAPING AN ELECTRIC FIELD OF A TOUCH SENSOR

RELATED APPLICATION

This application claims benefit under 35 U.S.C. §119(e) of U.S. Provisional Application Ser. No. 61/559,690, entitled "PROXIMITY SENSING," filed Nov. 14, 2011.

TECHNICAL FIELD

This disclosure relates generally to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine whether an object is touching or in proximity with the touch sensor or to determine the location of the touch or proximity with respect to the touch sensor.

DESCRIPTION OF EXAMPLE EMBODIMENTS

Figure 1:
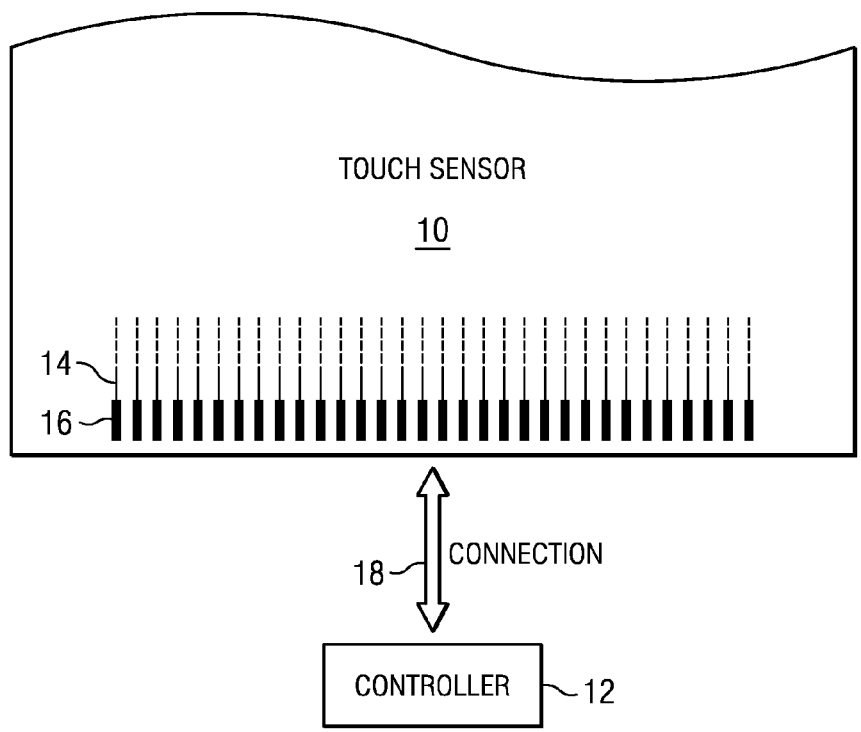
FIG. 1 illustrates an example touch sensor with an example touch-sensor controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of one or more drive and sense electrodes (or an array of one or more electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a ground electrode, a guard electrode, a drive electrode, or a sense electrode) may be an area of conductive material forming a shape, such as for example a disc, square, rectangle, thin line (e.g., a trace disposed on a horizontal or vertical section of a substrate), wire, loop, patch, other suitable two dimensional or three dimensional shape, or any suitable combination of these. In particular embodiments, one or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of polyethylene terephthalate (PET) or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of PET or another suitable material, such as a dielectric material. In a particular embodiment, the substrate is a printed circuit board with one or more layers. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. In other particular embodiments, the drive or sense electrodes include one or more sheets of metal or other conductive material. As an example and not by way of limitation, one or more portions of the conductive material may be copper or copper-based and have a thickness of approximately 5 μm or less and a width of approximately 10 μm or less. As another example, one or more portions of the conductive material may be silver or silver-based and similarly have a thickness of approximately 5 μm or less and a width of approximately 10 μm or less. This disclosure contemplates any suitable electrodes made of any suitable material.

Touch sensor 10 may implement a capacitive form of touch sensing. In a mutual-capacitance implementation, touch sensor 10 may include an array of one or more drive and sense electrodes forming an array of one or more capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of one or more electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor.

Figure 2:
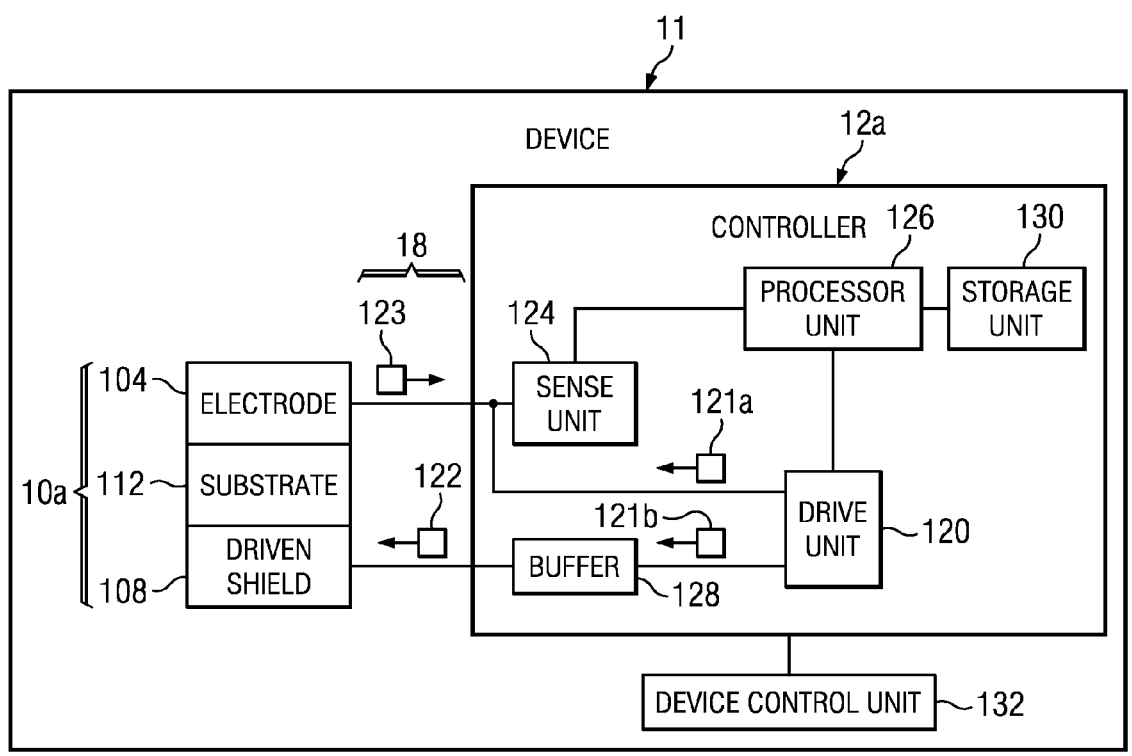
FIG. 2 illustrates an example device incorporating an example touch sensor with a driven shield for shaping an electric field of the example touch sensor.

FIG. 2 illustrates an example device 11 incorporating an example touch sensor 10a with a driven shield 108 for shaping an electric field of the touch sensor 10a. Device 11 may be any suitable electronic device that may perform one or more actions in response to the detection of a touch. For example, device 11 may be a vehicle or other engine-powered machine, thermostat, light, stereo, television, remote control, household or other appliance, desktop computer, laptop computer, tablet computer, personal digital assistant (PDA), smartphone, satellite navigation device, portable media player, portable game console, kiosk computer, point-of-sale device, or other suitable device.

Touch sensor 10a may include any suitable characteristics listed above with respect to touch sensor 10. In the embodiment depicted, touch sensor 10a includes an electrode 104, a driven shield 108, and a substrate 112 that insulates electrode 104 from driven shield 108. Electrode 104 and substrate 112 may have any suitable characteristics of the electrodes and substrates described above in connection with FIG. 1. The electrode 104 and driven shield 108 are coupled to touch-sensor controller 12a. Touch-sensor controller 12a may include any suitable characteristics described above with respect to touch sensor 10a. Touch-sensor controller 12a includes drive unit 120 for generating drive signals 121, buffer 128 for generating drive signal 122, sense unit 124 for analyzing sense signal 123 and detecting, by itself or in conjunction with processor unit 126, whether a touch or proximity input has occurred at electrode 104, and storage unit 130 for facilitating the operation of processor unit 126. Drive unit 120, sense unit 124, processor unit 126, and storage unit 130 may include any suitable characteristics of the drive unit, sense unit, processor unit, and storage unit described in connection with FIG. 1.

As used herein, a proximity input may refer to the location of an object in proximity to sensor 104. For example, a proximity input may be detected when an object is within a certain distance (e.g., 25 centimeters) from touch sensor 104. An object may be any suitable entity or thing that may couple the touch sensor 104 to ground through a capacitance of the object. For example, an object may be a human finger, hand, other body part, a stylus or other input device held by a human, or other suitable capacitive entity.

In typical devices, one or more electrodes of a touch sensor may generate omnidirectional or isotropic electrical fields that extend from the electrode in all directions. Such touch sensors may be capable of detecting the presence of an object in any direction, so long as the object is located within the range of the touch sensor. In particular applications, this omnidirectional sensing capability may result in unwanted device behavior. For example, such a touch sensor could be incorporated within a wall-mounted thermostat that is configured to turn a display on when a touch or proximity of an object is detected at the touch sensor. Accordingly, if a human's hand enters the zone behind the wall to which the thermostat is mounted, the thermostat may detect a touch and turn on the display, resulting in wasted power usage. Some devices include a ground plane placed behind the touch sensor to suppress the electric field emitted towards the back of the device. However, in such configurations, the electric field couples to the ground plane and reduces the proximity sensing range from the front side as well. The increased load on the touch sensor may result in inefficient operation or decreased range of the touch sensor, particularly in devices that operate with low voltages, such as battery operated electronics.

Particular embodiments of the present disclosure utilize a driven shield 108 to shape the electric field generated by an electrode 104 of touch sensor 10a. For example, when driven shield 108 is used, particular portions of the modified electric field from electrode 104 may not extend as far as they would in the absence of driven shield 108. This may result in a modified zone of touch detection capability for electrode 104. For example, if touch sensor 10a with electrode 104 and driven shield 108 is incorporated within a wall-mounted thermostat or other device, one or more electric fields emitted by touch sensor 10a may be modified such that touches or proximity inputs occurring at the front of the device are detected but touches or proximity inputs occurring at the back and/or sides of the device are not. Accordingly, such a device may perform particular actions (such as powering on a display) in response to touches or proximity inputs at the front of the device while ignoring touches or proximity inputs at the back and/or sides of the device. In particular embodiments, the electric field of electrode 104 may be modified to extend in any suitable direction.

FIG. 2 depicts a self capacitance sensing system that may modify an electric field of electrode 104. Electrode 104 is a sense electrode disposed on a substrate 112, such as a printed circuit board. In particular embodiments, electrode 104 is a single-layer conductor. Touch-sensor controller 12a may charge electrode 104 to a known potential. The touch-sensor controller 12a may then measure the charge of electrode 104 after one or more charge-and-transfer cycles and determine the capacitance of the electrode 104. Placing an object on or near the electrode 104 can introduce external capacitance that affects the flow of charge at the location of the object. This can register as a touch or proximity input. A self capacitance sensing system may measure a touch or proximity input by using the self capacitance of the electrode 104. In particular embodiments, a self capacitance sensing system may detect proximity of an object within a range, such as 25 cm, from electrode 104. A self capacitance sensing system may use parallel or sequential sensor measurement. In particular embodiments, a self capacitance sensing system may comprise two pins connecting the electrode 104 to a sense unit 124, a series resistor for reducing emission conducted noise, and a sampling capacitor for each electrode 104. The voltage across the sampling capacitor may be compared with a threshold voltage during measurement of the capacitance at electrode 104. In other particular embodiments, a self capacitance sensing system may comprise one pin connecting electrode 104 to sense unit 124 and one resistor per electrode 104. In such embodiments, the voltage at the electrode 104 may be measured using an analog-to-digital (ADC) converter of sense unit 124.

The electric field associated with the self capacitance of electrode 104 is projected away from the electrode 104 into the air while seeking to couple to ground or an object in close proximity to the electrode 104's electric field. Electric field lines may be projected into the air away from the electrode 104 in an omnidirectional pattern, that may be isotropic in the absence of external influences.

Driven shield 108 is configured to generate an electrical field in response to receiving a drive signal 122. The electrical field generated by driven shield 108 may shape the electrical field of electrode 104. In particular embodiments, drive signal 122 used to drive driven shield 108 is the same signal or substantially similar to the drive signal 121a used to drive electrode 104. Accordingly, the electrical fields generated by electrode 104 and driven shield 108 may have the same or substantially similar phases and polarities. For example, in a particular embodiment the phase difference between the electrical field generated by electrode 104 and the electrical field generated by driven shield 108 is less than 10 percent. That is, a phase delay of either electric field with respect to the other is less than $1/10$ of the period of the electric fields. As another example, the phase difference may be less than 5 percent or less than 1 percent. Similar phases will result in better operation since dissimilar phases between the electric fields will result in absorption by the driven shield 108 of the electric field generated by electrode 104. At least a portion of the electric field generated by driven shield 108 in response to receiving drive signal 122 may extend towards electrode 104. This portion of the electric field of driven shield 108 may effectively reduce the length of the electric field lines of a portion of the electric field of electrode 104 that extend towards driven shield 108 because charges of the same polarity repel each other. This concept is illustrated in more detail below in connection with the description of FIGS. 3A and 3B.

Driven shield 108 may be made of any suitable material that emits an electrical field in response to receiving an electrical signal. Driven shield 108 may include one or more conductive materials. For example, driven shield 108 may include ITO, copper, silver, a copper- or silver-based material, other suitable material, or any combination thereof. Driven shield 108 may have any suitable shape, such as for example a disc, square, rectangle, thin line (e.g., a trace disposed on a horizontal or vertical section of a substrate), a wire, a loop, a patch, other suitable two dimensional or three dimensional shape, or any suitable combination of these.

In particular embodiments, driven shield 108 may be made of the same material as electrode 104 or may have the same shape and dimensions as electrode 108. In other particular embodiments, the composition or shapes and dimensions of driven shield 108 and electrode 104 may be substantially similar. For example, the area of driven shield 108 may be within ten percent of the area of electrode 104. In particular embodiments, driven shield 108 may be larger than electrode 104 such that the electric field generated by driven shield 108 is stronger than the electric field generated by electrode 104. This may further repel the relevant portion of the electric field of electrode 104.

Although the embodiment of FIG. 2 depicts a single electrode 104 and a single driven shield 108, there may be multiple electrodes 104 or driven shields 108 in a device. In particular embodiments, the electric field from each electrode 104 may be shaped by one or more corresponding driven shields. Thus, in particular embodiments, at least one distinct driven shield 108 is provided for each electrode 104. In various embodiments, the electrodes 104 of a device are measured independently. For example, the electrodes 104 may be measured in succession to determine if a touch has occurred at any of the electrodes. For each electrode 104 and corresponding driven shield(s) 108, touch-sensor controller 12a (or multiple controllers) may provide distinct drive signals that are the same as or substantially similar to each other.

In particular embodiments, driven shield 108 is disposed on a face of substrate 112 directly opposite electrode 104. For example, the depiction of substrate 112 in FIG. 2 may represent a portion of a larger substrate, such as a printed circuit board. If electrode 104 is located on one surface of substrate 112, driven shield 108 may be placed on a surface below electrode 104. For example, if substrate 112 is double-sided, electrode 104 and driven shield 108 may be placed on substrate 112 at the same (or substantially similar) locations on opposite faces of the printed circuit board. As another example, if substrate 112 has multiple layers, driven shield 108 may be placed below electrode 104 at any of the layers. In addition or as an alternative, as explained in more detail in connection with FIG. 4, a driven shield 108 may be placed in the same plane as electrode 104.

In certain situations, electrode 104 may need to be placed directly over, or in close proximity to, a conductive surface, such as electrical ground or a metal object. In such situations, capacitive coupling between electrode 104 and the conductive surface can result in absorption of the electric field of electrode 104 by the conductive surface. In particular embodiments, this absorption is eliminated or reduced by placing an insulator over the conductive surface and placing driven shield 108 on top of the insulator. Substrate 112 may be disposed on the driven shield 108 and electrode 104 may be disposed on the substrate 112 as depicted. In such embodiments, the electric field from driven shield 108 may force the electric field of electrode 104 away from the conductive surface, limiting the amount of absorption of the electric field by the conductive surface.

Substrate 112 is configured to electrically insulate electrode 104 from driven shield 108. Substrate 112 may represent any suitable dielectric material, such as PET, a printed circuit board, air, or other suitable insulating material. Substrate 112 may have any suitable number of layers or sides.

Touch-sensor controller 12a facilitates the measurement of touches at one or more electrodes 104. In the embodiment depicted, touch-sensor controller 12a includes drive unit 120 that is configured to generate drive signals 121. A drive signal may include any suitable signaling, such as one or more electrical pulses, a change in a voltage level of the drive signal, a toggling of the drive signal from high to low or low to high, or other suitable signaling. In particular embodiments, drive unit generates drive signal 121a and transmits drive signal 121a to electrode 104 during measurement of a capacitance associated with electrode 104. Drive unit may also generate drive signal 121b that is sent to driven shield 108. In particular embodiments, drive signal 121b is the same signal or substantially the same signal as 121a. For example, drive signal 121b may have the same or substantially the same phase, polarity, and amplitude as drive signal 121a. Drive signal 121b may be sent directly to driven shield 108 (in which case the drive signals 121 would have the same or substantially the same amplitudes) or may be buffered via buffer 128 before being transmitted to driven shield 108. Buffer 128 may be a non-inverting amplifier that attenuates or amplifies drive signal 121b to generate drive signal 122. Drive signal 122 is then sent to driven shield 108. In particular embodiments, buffer 128 may provide an adjustable gain for drive signal 121b. In particular embodiments, drive signal 121b may be amplified by buffer 128 to increase the strength of the electric field of driven shield 108 and its effect on the electric field of electrode 104. As an example, if electric fields of equal strength from electrode 104 and driven shield 108 are desired and driven shield 108 is placed close to a conductive surface that absorbs a portion of the electric field of driven shield 108, signal 121b may be amplified to strengthen the electric field of driven shield 108 to the appropriate level. In particular embodiments, the electric field of driven shield 108 is driven to a level that will prevent the electric field of electrode 104 from coupling into the conductive surface located close to the driven shield 108.

Because the drive signals 121 sent to electrode 104 and driven shield 108 have the same or substantially the same polarities and phases, the electric fields generated by electrode 104 and driven shield 108 will also have the same or substantially the same polarities and phases. Thus, portions of the respective electric fields from electrode 104 and driven shield 108 that extend towards each other will repel each other.

In various embodiments, the shaping of the electric field of electrode 104 may be adjusted by changing parameters including, at least, the size or shape of driven shield 108, the spacing between electrode 104 and driven shield 108, and the amplitude of the drive signal 122 for the driven shield.

After drive signal 121a is sent to electrode 104 (or in between a series of drive signals 121a), sense unit 124 may analyze sense signal 123 from electrode 104. In particular embodiments, sense signal 123 may indicate a voltage of electrode 104. By analyzing sense signal 123, sense unit 124, alone in combination with processor unit 126, may determine a capacitance associated with electrode 104. The capacitance may be indicative of whether or not a touch or proximity input is occurring at electrode 104. Processor unit 126 may analyze results from various electrodes 104 to determine the location of a touch.

Processor unit 126 may communicate the results of sensing to device control unit 132. Device control unit 132 may be operable to control one or more functions of device 11. Device control unit 132 may initiate any suitable action of device 11 based on whether or not a touch or proximity input has occurred at electrode 104. For example, device control unit 132 may start or stop an application of device 11 based on a user's proximity to a device. As another example, device control unit 132 may activate back-lighting of a control panel of device 11 in response to a detection that an object is in proximity to the device 11. As a further example, device 11 may stay in a sleep or other low-power mode until an object's presence is detected. As yet another example, device control unit 132 may reduce radio frequency (RF) power emission of device 11 when a touch or proximity input is detected. Such embodiments may enable an intuitive user interface for device 11 and decreased power usage.

Although certain steps are described above as being performed by certain components, in general, the steps may be performed by any suitable components. Although FIG. 2 illustrates an electrode, substrate, driven shield, controller, and device control unit, FIG. 2 contemplates any number or arrangement of such components for detecting touches or proximity inputs. Although, the embodiment depicted in FIG. 2 shows a self capacitance system, various embodiments could include a mutual capacitance system wherein electric fields of one or more drive electrodes are shaped by one or more corresponding driven shields 108.

Figure 3A:
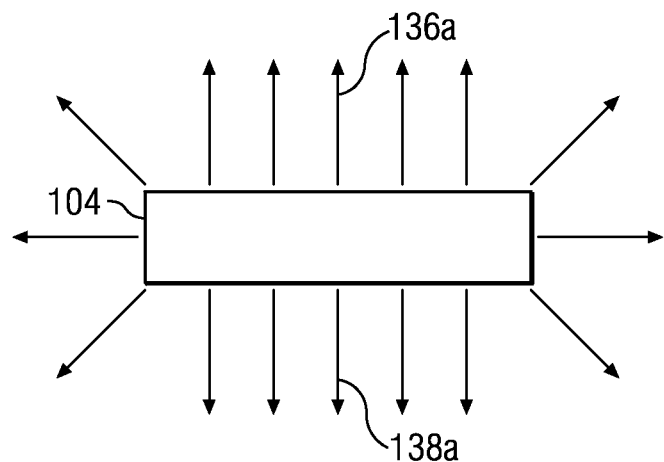
FIGS. 3A and 3B illustrates example electric fields of an electrode of the example touch sensor and the example driven shield of FIG. 2.
Figure 3B:
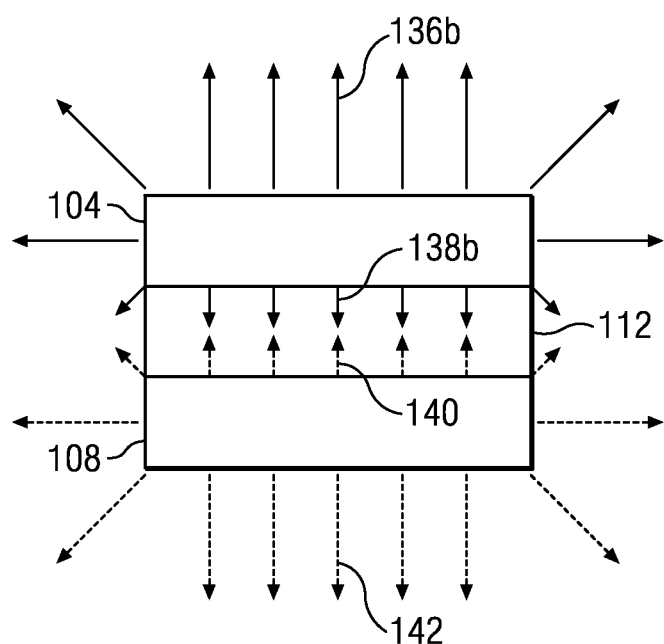

FIGS. 3A and 3B illustrates example electric fields of the electrode 104 of and the driven shield 108 of FIG. 2. FIG. 3A depicts the electric field of electrode 104. Electric field lines 136a are the electric field lines that extend towards the front and sides of electrode 104 and electric field lines 138a are the electric field lines that extend toward the back of electrode 104. As depicted, the electric field lines 136a and 138a of electrode 104 extend in every direction from electrode 104. In particular situations, the electric field may be isotropic. That is, the electric field lines 136a and 138a may be of equal length in each direction. As noted above, this may be problematic in certain situations, since electrode 104 may respond to proximity inputs that occur in any direction, including the back of electrode 104.

FIG. 3B depicts the electric fields of electrode 104 and driven shield 108. The electric field lines 136b extending towards the front and sides of electrode 104 are of similar length to the electric field lines 136a in the absence of driven shield 108 as depicted in FIG. 3A. However, the electric field lines 138b that extend towards the back of electrode 104 are significantly shorter due to the repelling effect of electric field lines 140 of driven shield 108 that extend towards the front of driven shield 108. Accordingly, the electric field lines 138b of electrode 104 do not extend far enough to couple to an object placed at the back of driven shield 108 and thus cannot detect a touch or proximity input that occurs at the back of driven shield 108. While an object may be located within the electric field of driven shield 108 (e.g., an object may be present at the back of the driven shield), this presence will not be detected since only the electrode 104 (and not the driven shield 108) is sensed.

Although, FIGS. 2 and 3B depict driven shield 108 as being directly beneath electrode 104, one or more driven shields may be placed in any suitable locations to shape the electric field of electrode 104 in a desired fashion. For example, driven shield 108 may be placed at the side of electrode 104 or diagonal to electrode 104.

Figure 4:
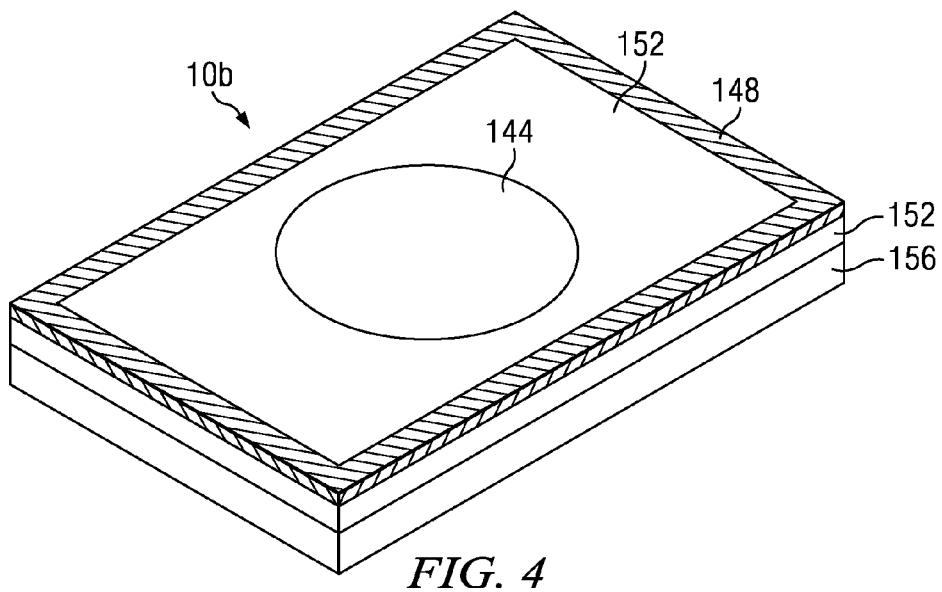
FIG. 4 illustrates an example touch sensor with multiple driven shields for shaping an electric field of the example touch sensor.

FIG. 4 illustrates an example touch sensor 10b with multiple driven shields 148 and 156 for shaping an electric field of touch sensor 10b. Touch sensor 10b may include any suitable characteristics listed above with respect to touch sensor 10 or touch sensor 10a. Touch sensor 10b includes an electrode 144, substrate 152, and driven shields 148 and 156 that may have any suitable characteristics described above in connection with electrode 104, substrate 112, and driven shield 108 respectively.

Electrode 144 of touch sensor 10b is a disc-shaped plate. Driven shield 148 is a shielding loop that is located in the same plane as electrode 144 and electrically insulated from electrode 144. Driven shield 156 is a rectangular plate electrically insulated from electrode 144 by substrate 152. In particular embodiments, driven shields 148 and 156 are driven with drive signals that have the same or substantially similar phases and polarity as a drive signal sent to electrode 144. Accordingly, the respective electric fields generated by driven shields 148 and 156 and electrode 144 may have the same or substantially similar polarities and phases. Driven shield 148 may be configured to repel portions of the electric field generated by electrode 144 that extend towards the sides of 10b (i.e., that extend towards driven shield 148). The addition of driven shield 148 further shapes the electric field of electrode 144, such that the electric field is stronger (more sensitive to a touch or proximity input) in the direction perpendicular to the front surface of electrode 144 and weaker (less sensitive to a touch or proximity input) as the angle away from the perpendicular increases. For illustrative purposes, the electrode 144 can be considered as effectively being located in a shielding "shoebox" formed by the combination of the driven shield 156 (the bottom of the shoebox) and driven shield 148 (the sides of the shoebox), such that the electric field of electrode 144 is effectively limited to the volume of space above the shoebox. Accordingly, the electrical field of electrode 144 is shaped such that it generally extends upward from electrode 144, but not past either driven shield 148 or 156.

The shaping of the electrical field of electrode 144 may be adjusted by changing the values of parameters including, at least, the size or shape of driven shield 148, the spacing between the electrode 144 and driven shield 148, and the amplitude of the drive signal for driven shield 148. In particular embodiments, driven shields 148 and 156 are driven with signals that have the same or substantially similar amplitudes. In other embodiments, the drive signal amplitude for driven shield 148 may be independent of the drive signal amplitude for driven shield 156. For example, the amplitude of the drive signal sent to driven shield 148 may be adjusted independently of the drive signal amplitude for driven shield 156 to obtain the desired shaping results.

Figure 5:
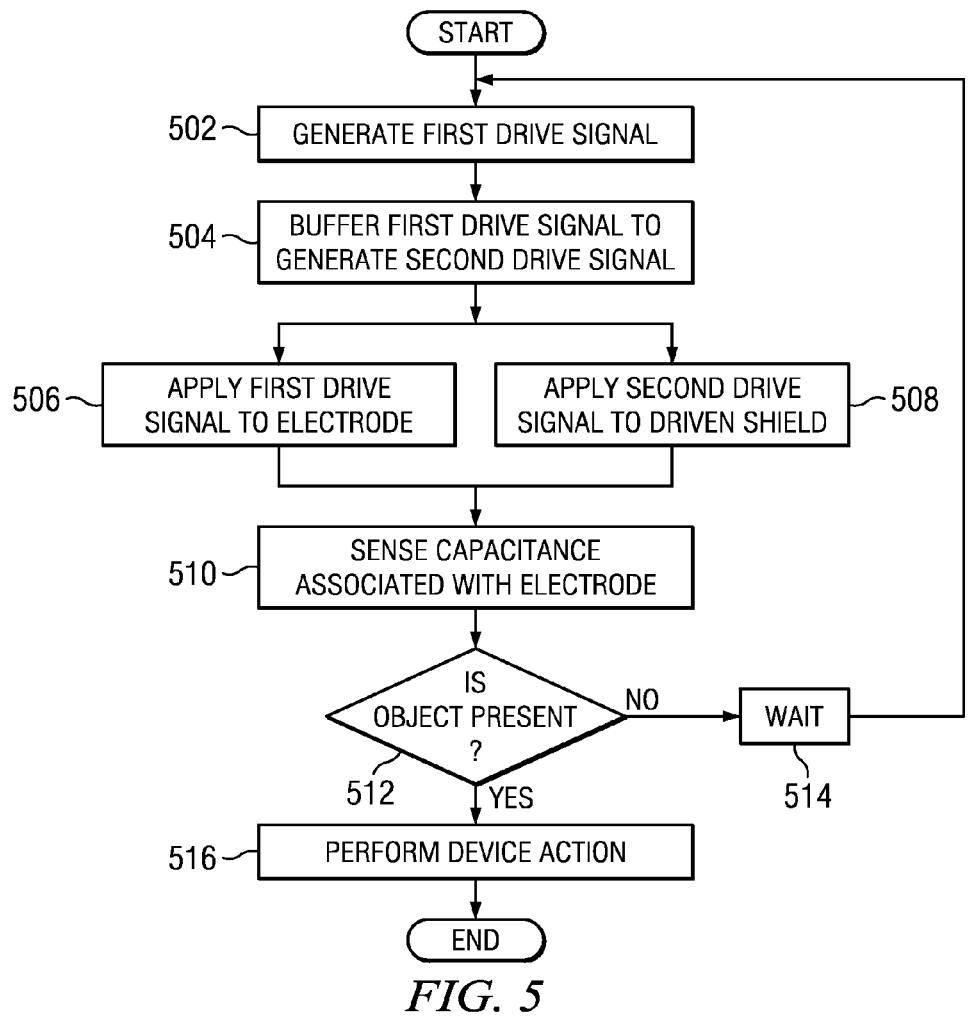
FIG. 5 illustrates an example method for shaping the electric field of an example touch sensor.

FIG. 5 illustrates an example method for shaping the electric field of a touch sensor. For illustrative purposes, FIG. 5 will be described with respect to the embodiment depicted in FIG. 2. The method may start at step 502, where a first drive signal is generated. For example drive signal 121 may be generated. The first drive signal may be any suitable signal or combination of signals. For example, the first drive signal may be a series of electrical pulses. At step 504, the first drive signal is buffered to generate a second drive signal. As an example, drive signal 121 may be buffered to generate drive signal 122. Buffering may include passing the first drive signal through a non-inverting amplifier that amplifies the first drive signal. At step 506, the first drive signal is applied to a sensing electrode. For example, drive signal 121a may be sent to electrode 104. The first drive signal may induce the generation of an electric field by the sensing electrode. This electric field may couple to an object placed in proximity to the electric field and result in a change of capacitance of the sensing electrode.

Concurrently with step 506, the second drive signal is applied to a driven shield. For example, drive signal 122 may be applied to driven shield 108. The second drive signal may induce the generation of an electric field by the driven shield. This electric field may be similar in phase and polarity to the electric field generated by the sensing electrode. This electric field may influence the electric field generated by the sensing electrode such that one or more portions of the electric field do not extend as far as they would in the absence of the electric field of the driven shield.

At step 510, a capacitance associated with the sense electrode is measured. For example, sense unit 124 may analyze a sense signal 123 from electrode 104 and processor unit 126 may determine a self capacitance of electrode 104. At step 512, it is determined whether an object is present (e.g., within a range of the sensing electrode) based on the capacitance measured at step 510. If it is determined that an object is not present, a waiting period is entered at step 514. As an example, during this waiting period, steps similar to steps 502-516 may be performed for other electrodes 104 of device 11. After the waiting period is over, steps 502-512 may be repeated. If it is determined at step 512 that an object is present, then a device action is performed at step 516, at which point the method may end. Any suitable device action may be performed, such as stopping or starting device 11 or an application of device 11.

Particular embodiments may repeat the steps of the method of FIG. 5, where appropriate. Moreover, although this disclosure describes and illustrates particular steps of the method of FIG. 5 as occurring in a particular order, this disclosure contemplates any suitable steps of the method of FIG. 5 occurring in any suitable order. Furthermore, although this disclosure describes and illustrates particular components, devices, or systems carrying out particular steps of the method of FIG. 5, this disclosure contemplates any suitable combination of any suitable components, devices, or systems carrying out any suitable steps of the method of FIG. 5.

Particular embodiments of the present disclosure may provide one or more or none of the following technical advantages. In particular embodiments, a driven shield may shape the electric field of a touch sensor such that only proximity inputs in particular directions are detected by the touch sensor. Some embodiments may provide multiple driven shields that shape multiple electric fields generated by multiple electrodes of a touch sensor. Particular embodiments may facilitate decreased power usage in electronic devices.

Herein, reference to a computer-readable non-transitory storage medium or media may include one or more semiconductor-based or other integrated circuits (ICs) (such, as for example, a field-programmable gate array (FPGA) or an application-specific IC (ASIC)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards, SECURE DIGITAL drives, any other suitable computer-readable non-transitory storage medium or media, or any suitable combination of two or more of these, where appropriate. A computer-readable non-transitory storage medium or media may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A device comprising:
   a capacitive touch sensor configured to store an amount of charge indicative of whether an object is within a range of the capacitive touch sensor, the capacitive touch sensor configured to generate a first electric field that extends in a plurality of directions in response to receiving a first drive signal comprising a first plurality of electrical pulses;
   a first conductive shield located in the same plane as the capacitive touch sensor, the first conductive shield configured to shape the first electric field by generating a second electric field in response to receiving a second drive signal comprising a second plurality of electrical pulses, the first conductive shield forming a loop around the capacitive touch sensor, the second drive signal having the same phase and polarity as the first drive signal such that the first conductive shield is configured to shape a first portion of the first electric field;
   a second conductive shield located in a plane that is parallel to a plane that includes the capacitive touch sensor, the second conductive shield configured to further shape the first electric field by generating a third electric field in response to receiving a third drive signal comprising a third plurality of electrical pulses, the third drive signal having the same phase and polarity as the first drive signal such that the second conductive shield is configured to shape a second portion of the first electric field;
   wherein the first conductive shield and the second conductive shield are configured to shape the first electric field such that the first electric field generally extends in a direction opposite of the second conductive shield;
   a control unit coupled to the capacitive touch sensor and the first and second conductive shields, the control unit comprising a pulse driver configured to:
     drive the capacitive touch sensor with the first drive signal;
     drive the first conductive shield with the second drive signal;
     drive the second conductive shield with the third drive signal;
     adjust the second drive signal from a first amplitude to a second amplitude such that the second electric field of the first conductive shield further shapes the first portion of the first electric field; and
     adjust the third drive signal from a third amplitude to a fourth amplitude such that the third electric field of the second conductive shield further shapes the second portion of the first electric field;
   a transparent cover panel overlaying at least a portion of the capacitive touch sensor; and
   a display overlaid by at least a portion of the capacitive touch sensor.

2. The device of claim 1, further comprising:
   another capacitive touch sensor coupled to the control unit and configured to store an amount of charge indicative of whether an object is within a range of the another capacitive touch sensor, the another capacitive touch sensor configured to generate a fourth electric field that extends in a plurality of directions in response to receiving a fourth drive signal comprising a fourth plurality of electrical pulses; and
   a third conductive shield coupled to the control unit and configured to shape the fourth electric field by generating a fifth electric field in response to receiving a fifth drive signal comprising a fifth plurality of electrical pulses, the fifth drive signal having the same phase and polarity as the fourth drive signal;
   wherein the control unit comprising the pulse driver is further configured to drive the another capacitive touch sensor with the fourth drive signal and the third conductive shield with the fifth drive signal.

3. An apparatus comprising:
a touch sensor configured to store an amount of charge indicative of whether an object is within a range of the touch sensor, the touch sensor configured to generate a first electric field that extends in a plurality of directions;
a first conductive shield located in the same plane as the touch sensor, the first conductive shield configured to shape the first electric field by generating a second electric field, the first conductive shield forming a loop around the touch sensor, the first conductive shield configured to shape a first portion of the first electric field;
a second conductive shield located in a plane that is parallel to a plane that includes the touch sensor, the second conductive shield configured to further shape the first electric field by generating a third electric field, the second conductive shield configured to shape a second portion of the first electric field;
wherein the first conductive shield and the second conductive shield are configured to shape the first electric field such that the first electric field generally extends in a direction opposite of the second conductive shield; and
a control unit configured to:
drive the touch sensor with a first drive signal that causes the generation of the first electric field;
drive the first conductive shield with a second drive signal that causes the generation of the second electric field;
drive the second conductive shield with a third drive signal that causes the generation of the third electric field;
adjust the second drive signal from a first amplitude to a second amplitude such that the second electric field of the first conductive shield further shapes the first portion of the first electric field; and
adjust the third drive signal from a third amplitude to a fourth amplitude such that the third electric field of the second conductive shield further shapes the second portion of the first electric field.

4. The apparatus of claim 3, wherein the first drive signal and the second drive signal have substantially similar polarities and phases.

5. The apparatus of claim 3, further comprising a dielectric layer positioned between the touch sensor and the first conductive shield.

6. The apparatus of claim 3, wherein the touch sensor and the first conductive shield have substantially distinct geometries.

7. The apparatus of claim 3, wherein the second conductive shield and the touch sensor have the same geometries and the geometries of the second conductive shield and the touch sensor are distinct from the geometry of the first conductive shield.

8. The apparatus of claim 3, wherein the first drive signal and the second drive signal have equal amplitudes.

9. The apparatus of claim 3, further comprising a buffer operable to amplify or attenuate the first drive signal to generate the second drive signal.

10. The apparatus of claim 3, further comprising:
a ground layer comprising a conductive material operable to absorb one or more of a third portion of the first electric field and a portion of the second electric field; and
a dielectric layer disposed between the ground layer and the first conductive shield.

11. The apparatus of claim 3, wherein the first electric field is generated by a first electrode of the touch sensor, and the apparatus further comprises:
a second electrode configured to store an amount of charge indicative of whether an object is within a range of the second electrode, the second electrode configured to generate a fourth electric field that extends in a plurality of directions; and
a third conductive shield configured to shape the fourth electric field by generating a fifth electric field.

12. The apparatus of claim 3, further comprising:
a first buffer operable to amplify or attenuate the first drive signal to generate the second drive signal, the first buffer configured to adjust the amplitude of the first drive signal based at least in part on one or more of a portion of the first electric field and a portion of the second electric field; and
a second buffer operable to amplify or attenuate the first drive signal to generate the third drive signal, the second buffer configured to adjust the amplitude of the first drive signal based at least in part on one or more of a portion of the first electric field and a portion of the third electric field.

13. The apparatus of claim 3, further comprising:
a first substrate located in the same plane as the touch sensor, the first substrate configured to electrically insulate the touch sensor from the first conductive shield; and
a second substrate located in a plane that is between the plane that includes the touch sensor and a plane that includes the second conductive shield, the second substrate configured to electrically insulate the touch sensor from the second conductive shield.

14. A method comprising:
generating, by a control unit, a first drive signal, a second drive signal, and a third drive signal;
emitting, by a touch sensor, a first electric field that extends in a plurality of directions in response to reception of the first drive signal;
shaping, by a first conductive shield located in the same plane as the touch sensor, a first portion of the first electric field that extends from the touch sensor towards the first conductive shield by generating a second electric field in response to reception of the second drive signal, the first conductive shield forming a loop around the touch sensor;
shaping, by a second conductive shield located in a plane that is parallel to a plane that includes the touch sensor, a second portion of the first electric field that extends from the touch sensor towards the second conductive shield by generating a third electric field in response to reception of the third drive signal,
wherein the first conductive shield and the second conductive shield shape the first electric field such that the first electric field generally extends in a direction opposite of the second conductive shield;
adjusting, by the control unit, the second drive signal from a first amplitude to a second amplitude such that the second electric field of the first conductive shield further shapes the first portion of the first electric field; and
adjusting, by the control unit, the third drive signal from a third amplitude to a fourth amplitude such that the third electric field of the second conductive shield further shapes the second portion of the first electric field.

15. The method of claim 14, wherein the first drive signal and the second drive signal have equal phases and polarities.

16. The method of claim 14, further comprising detecting whether an object is within a range of the touch sensor based on a change in capacitance of the touch sensor in response to the first drive signal.

17. The method of claim 14, wherein the first drive signal and the second drive signal have the same amplitudes.

18. A device comprising:
- a touch sensor configured to store an amount of charge indicative of whether an object is within a range of the touch sensor, the touch sensor configured to generate a first electric field that extends in a plurality of directions;
- a first conductive shield located in the same plane as the touch sensor, the first conductive shield configured to shape the first electric field by generating a second electric field, the first conductive shield configured to shape a first portion of the first electric field, the first conductive shield forming a loop around the touch sensor;
- a second conductive shield located in a plane that is parallel to a plane that includes the touch sensor, the second conductive shield configured to further shape the first electric field by generating a third electric field, the second conductive shield configured to repel shape a second portion of the first electric field;
- wherein the first conductive shield and the second conductive shield are configured to shape the first electric field such that the first electric field generally extends in a direction opposite of the second conductive shield;
- a control unit configured to:
  - drive the touch sensor with a first drive signal that causes the generation of the first electric field;
  - drive the first conductive shield with a second drive signal that causes the generation of the second electric field;
  - drive the second conductive shield with a third drive signal that causes the generation of the third electric field;
  - adjust the second drive signal from a first amplitude to a second amplitude such that the second electric field of the first conductive shield further shapes the first portion of the first electric field; and
  - adjust the third drive signal from a third amplitude to a fourth amplitude such that the third electric field of the second conductive shield further shapes the second portion of the first electric field;
- a sensing unit configured to sense when an object is within the range of the touch sensor based on a change of capacitance of the touch sensor in response to the first drive signal; and
- a logic circuit in communication with the sensing unit and configured to initiate an action of the device upon sensing that the object is within the proximity of the touch sensor.

19. The device of claim 18, wherein the action comprises turning on a display of the device.

20. The device of claim 18, wherein the action comprises reducing the magnitude of at least one radio frequency transmission of the device.

21. The device of claim 18, wherein the action comprises powering on the device, powering off the device, or awakening the device from a sleep mode.

* * * * *